United States Patent
Hsu et al.

(10) Patent No.: US 6,686,273 B2
(45) Date of Patent: Feb. 3, 2004

(54) METHOD OF FABRICATING COPPER INTERCONNECTS WITH VERY LOW-K INTER-LEVEL INSULATOR

(75) Inventors: Sheng Teng Hsu, Camas, WA (US); Wei Pan, Vancouver, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 09/965,582

(22) Filed: Sep. 26, 2001

(65) Prior Publication Data

US 2003/0060036 A1 Mar. 27, 2003

(51) Int. Cl.[7] .................... H01L 21/4763; H01L 21/302
(52) U.S. Cl. ..................... 438/638; 438/623; 438/624; 438/706
(58) Field of Search ................... 438/622–624, 438/629, 637–640, 706

(56) References Cited

U.S. PATENT DOCUMENTS 6,093,966 A * 7/2000 Venkatraman et al.
6,140,226 A * 10/2000 Grill et al.
6,303,486 B1 * 10/2001 Park

* cited by examiner

Primary Examiner—Ha Tran Nguyen
(74) Attorney, Agent, or Firm—Matthew D. Rabdau; David C. Ripma; Scott C. Krieger

(57) ABSTRACT

A method of forming a low-k inter-level insulator structure is provided comprising the steps of: providing a first metal layer; depositing a sacrificial insulator layer overlying the first metal layer; producing a second metal layer; removing the sacrificial insulator layer; and depositing a low-k inter-level insulator, whereby low-k material replaces the sacrificial insulator. An intermediate insulator layer structure is also provided comprising a sacrificial insulator layer overlying a low-k insulator layer, such that the sacrificial insulator layer may be subjected to processes, including CMP, which may be incompatible with low-k insulator materials.

19 Claims, 3 Drawing Sheets

METHOD OF FABRICATING COPPER INTERCONNECTS WITH VERY LOW-K INTER-LEVEL INSULATOR

BACKGROUND OF THE INVENTION

This invention relates to inter-level isolation of interconnects in semiconductor devices and more particularly to integration processes for producing very low-k isolation of copper interconnects.

Copper interconnects are formed using a dual damascene process. The incorporation of low-k insulator material may be accomplished by depositing a first layer of low-k dielectric material over a copper interconnect. This may be followed by an optional etch stop barrier insulator and then a second layer of low-k material. A via is then etched through the second layer of low-k material, any etch stop barrier insulator, and the first layer of low-k dielectric material to reach the copper interconnect. A trench is then etched into the second layer of low-k material to aid in forming another layer of copper interconnects. Barrier metal and copper are deposited by sputtering, CVD, electrochemical deposition, or a combination of these methods. The deposited copper, and possibly the barrier metal, will then be planarized using CMP to form copper interconnects.

Materials having very low dielectric constants, less than approximately 2, tend to have poor mechanical strength. Due to this poor mechanical strength, these materials may not support CMP processes necessary for copper damascene interconnect fabrication.

SUMMARY OF THE INVENTION

Accordingly, a method of fabricating copper interconnects with very low-k inter-level insulators is provided. A method of forming a low-k inter-level insulator structure is provided comprising the steps of: providing a first metal layer; depositing a sacrificial insulator layer overlying the first metal layer; producing a second metal layer; removing the sacrificial insulator layer; and depositing a low-k inter-level insulator, whereby low-k material replaces the sacrificial insulator.

An intermediate insulator layer structure is also provided comprising a sacrificial insulator layer overlying a low-k insulator layer, such that the sacrificial insulator layer may be subjected to processes, including CMP, which may be incompatible with low-k insulator materials.

DETAILED DESCRIPTION OF THE INVENTION

Figure 1:
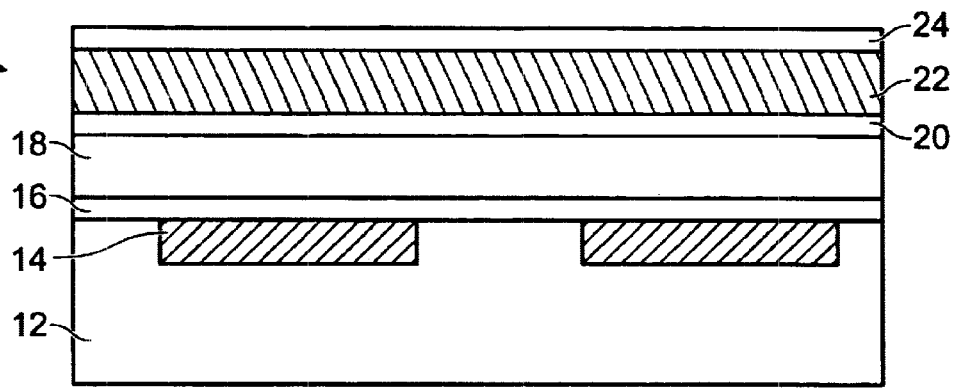
FIG. 1 is a cross sectional view of a low-k inter-level insulator structure after initial processing.

FIG. 1 is shows an interconnect structure 10 following some initial processing. The interconnect structure 10 comprises a substrate 12 following planarization and formation of a first metal layer 14, which is preferably copper. Although barrier metal is not shown, throughout the figures, for ease of illustration, a barrier metal, such as TiN, TaN, $Ti_xTa_yN_z$, or WN, is deposited prior to deposition of copper as necessary, or desired. A passivation insulator 16 is deposited overlying the first metal layer 14 to reduce, or eliminate, copper out diffusion. The passivation layer 16 is preferably SiC, $Si_xN_y$, or BN. A first layer of low-k material 18 is deposited overlying the passivation insulator 16. The first layer of low-k material 18 is preferably a very low-k material such as porous silicon oxide, xergel, or Hydrogen-silsesquioxane Resin (HSQ). The first layer of low-k material 18 is preferably deposited by a spin-on process or by CVD to a thickness approximately equal to the desired distance between two metal layers.

Preferably, an etch stop insulator 20 is deposited overlying the first layer of low-k material 18. The etch stop insulator 20 is preferably a material such as $SiO_2$, $Si_3N_4$, SiC, or BN. In another embodiment, no etch stop insulator is deposited.

A first sacrificial insulator layer 22 is deposited overlying the etch stop insulator 20. The first sacrificial insulator layer 22 is a material with sufficient mechanical strength to be suitable for CMP and other processes, and generally has a higher dielectric constant than desired for very low-k insulator applications. The first sacrificial insulator layer 22 is preferably silicon nitride ($Si_3N_4$) or silicon dioxide ($SiO_2$). The first sacrificial insulator layer 22 will preferably have a thickness approximately equal to a desired thickness of a second metal layer, which is to be formed subsequently. For example, the first sacrificial insulator layer 22 may be on the order of approximately 500 nm thick. A hard mask 24 is deposited over the first sacrificial insulator layer 22.

In a preferred embodiment in which no etch stop insulator is deposited, the first sacrificial insulator layer 22 and low-k material are selected to complement each other to provide the ability to selectively etch one versus the other. For example, silicon nitride ($Si_3N_4$) may be used for the first sacrificial insulator layer 22, when porous silicon oxide is the low-k material, since they can be selectively etched. Alternatively, if xergel, or HSQ is used for the low-k material either silicon nitride ($Si_3N_4$) or silicon dioxide may be used as the first sacrificial insulator layer 22.

Figure 2:
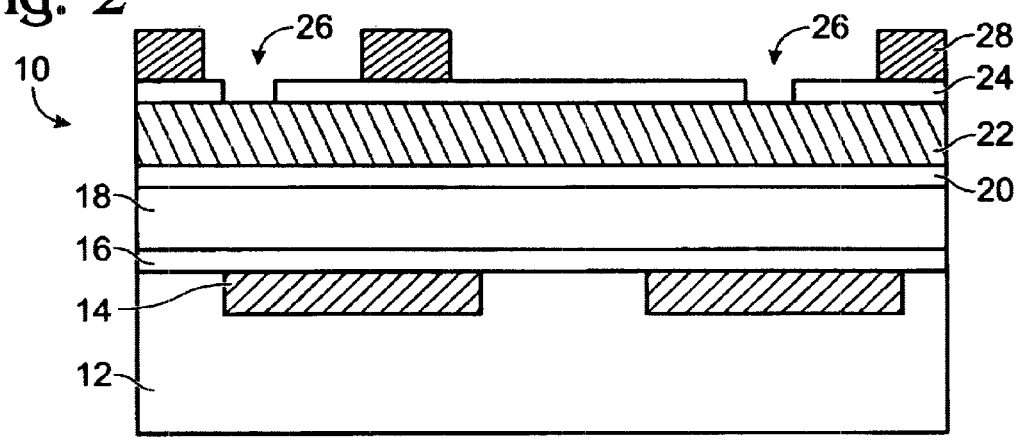
FIG. 2 is a cross sectional view of a low-k inter-level insulator structure following photoresist patterning.

Referring now to FIG. 2, one or more via openings 26 is etched into the hard mask 24 by applying photoresist and etching. The photoresist is then removed. A second photoresist mask 28 is deposited and patterned. The first sacrificial insulator layer 22 is etched to form a via at the via openings 26. The etch stop insulator 20 is removed from the bottom of the via formed in the first sacrificial insulator layer. The hard mask 24 is removed from the areas not protected by the second photoresist mask 28. Preferably, both the etch stop insulator 20 and the hard mask 24 are removed simultaneously.

Figure 3:
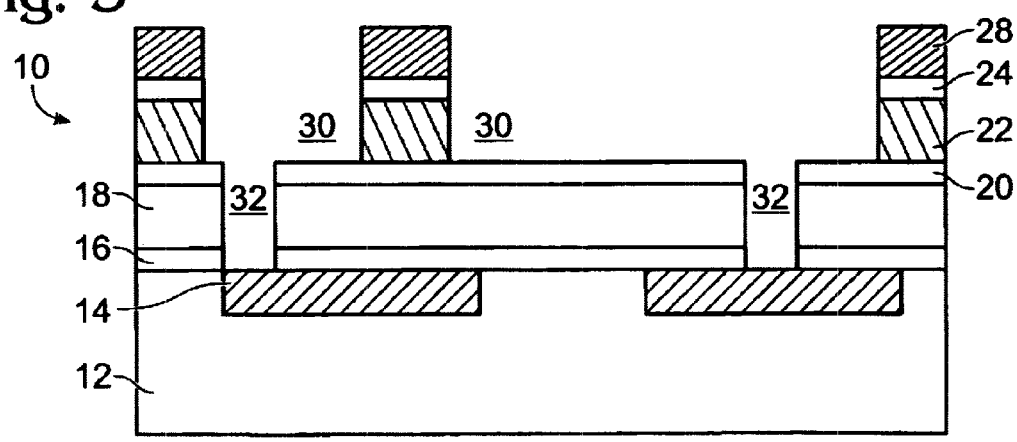
FIG. 3 is a cross sectional view of a low-k inter-level insulator structure following via and trench formation.

Referring now to FIG. 3, the first sacrificial layer 22 is etched where it is not protected by the second photoresist mask 28 down to the etch stop insulator 20 to form a trench 30. The first layer of low-k material 18 is also etched, preferably until the passivation insulator 16 is also removed to form a via 32. Alternatively the passivation insulator 16 can be removed in a separate etch step. Preferably, a single anisotropic etch process can be used to etch the first layer of low-k material 18 and the first sacrificial layer 22 at the same time. After etching the trench 30, the second photoresist mask 28 can be stripped. Since the etch stop insulator 20 has a higher dielectric constant than the first layer of low-k material, it may be preferable to remove the etch stop insulator 20 from the bottom of the trench 30. Note that if the etch stop insulator 20 is to be removed, that must be accounted for in terms of the desired distance between metal layers.

Figure 4:
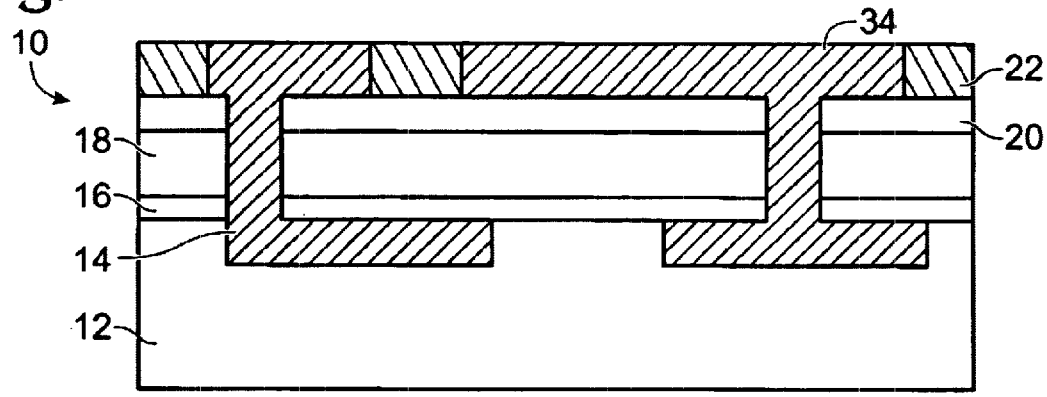
FIG. 4 is a cross sectional view of a low-k inter-level insulator structure following metal deposition and polishing.

Following formation of the trenches and vias, barrier metal and copper is deposited. Copper, and possibly barrier metal, is planarized to the level of the first sacrificial layer 22 using CMP to form a second metal layer 34, as shown in FIG. 4. The first sacrificial layer 22, as discussed above, is a material that is chosen because it has the mechanical strength compatible with the CMP process. In addition, the copper lines and vias assist in supporting the first layer of low-k material 18. The hard mask 24 is also removed before or during the CMP process.

Figure 5:
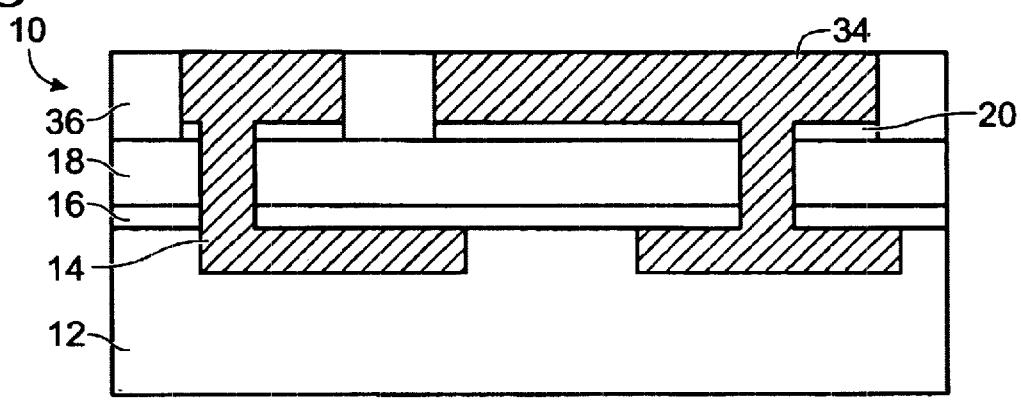
FIG. 5 is a cross sectional view of a low-k inter-level insulator structure following removal of a sacrificial layer and replacement with a low-k insulator material.

The first sacrificial layer 22 is removed. The first sacrificial layer 22 can be removed by either a selective wet etch or selective dry etch process. Since copper will not be etched during oxide or nitride plasma etching, the selective dry etch of the sacrificial insulator 22 can be readily accomplished. It is preferable, to remove any remaining etch stop insulator 20 remaining over the first layer of low-k material 18, since it has a dielectric constant higher than the low-k material. A second low-k layer 36 is deposited, preferably by a spin-on process, and etched back to expose the second metal layer 34, as is shown in FIG. 5. The interconnect structure 10 has an upper surface, at this stage, which is not as flat as would be achieved if CMP were possible with low-k materials. A second passivation insulator 38 is deposited.

Figure 6:
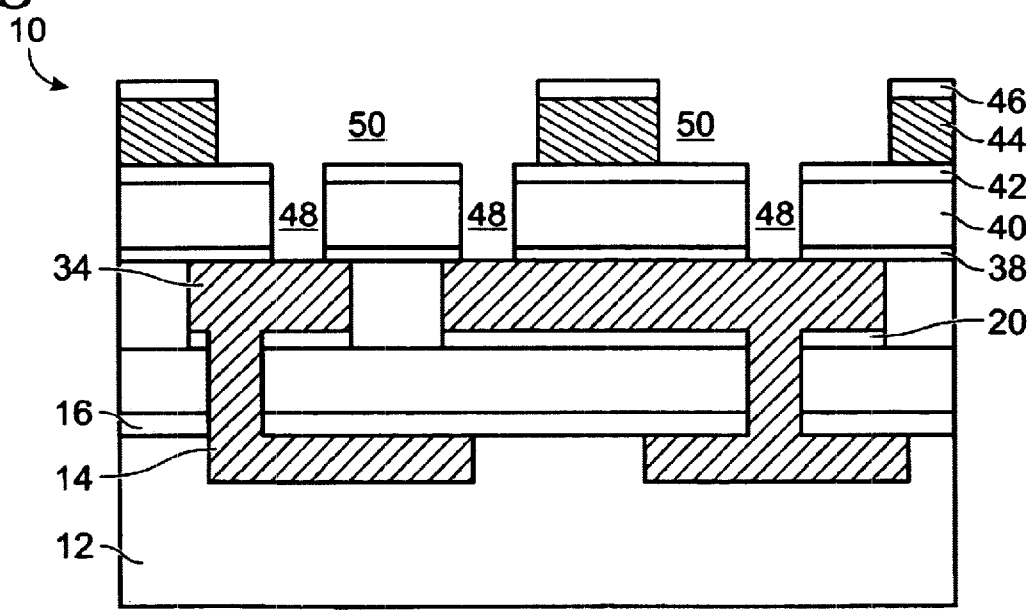
FIG. 6 is a cross sectional view of a low-k inter-level insulator structure following patterning, and trench/via formation, for an additional metal layer.

Referring now to FIG. 6, a third low-k layer 40 is deposited, preferably by spin coating. The third low-k layer 40 is deposited to a thickness equal to, or greater than, the desired distance between the second metal layer 34 and the next metal layer to be formed. The thickness is preferably between approximately 500 nm and 1000 nm. After depositing the third low-k layer 40, the interconnect structure 10 has an upper surface that is almost as flat as can be achieved by CMP. A second etch stop insulator 42 is deposited followed by a second sacrificial insulator 44. The second sacrificial insulator 44 is equal to, or slightly thicker than, the desired thickness of the next metal layer to be formed. If it is considered desirable at this stage for the interconnect structure 10 to have a flatter upper surface, a CMP process can be used to polish the second sacrificial insulator 44. The second sacrificial insulator 44 is capped with a second hard mask 46. Using a process similar to the one discussed above, a photoresist mask can be used to form via openings in the second hard mask 46 to allow for formation of a second set of vias 48. An additional photoresist mask can be patterned to allow for formation of a second set of trenches 50. Following etching, or removal, of the second sacrificial insulator 44, the third low-k layer 40, the second etch stop insulator 42, the second barrier layer 38 and stripping of any remaining photoresist, the interconnection structure 10 similar to that shown in FIG. 6 is achieved.

Figure 7:
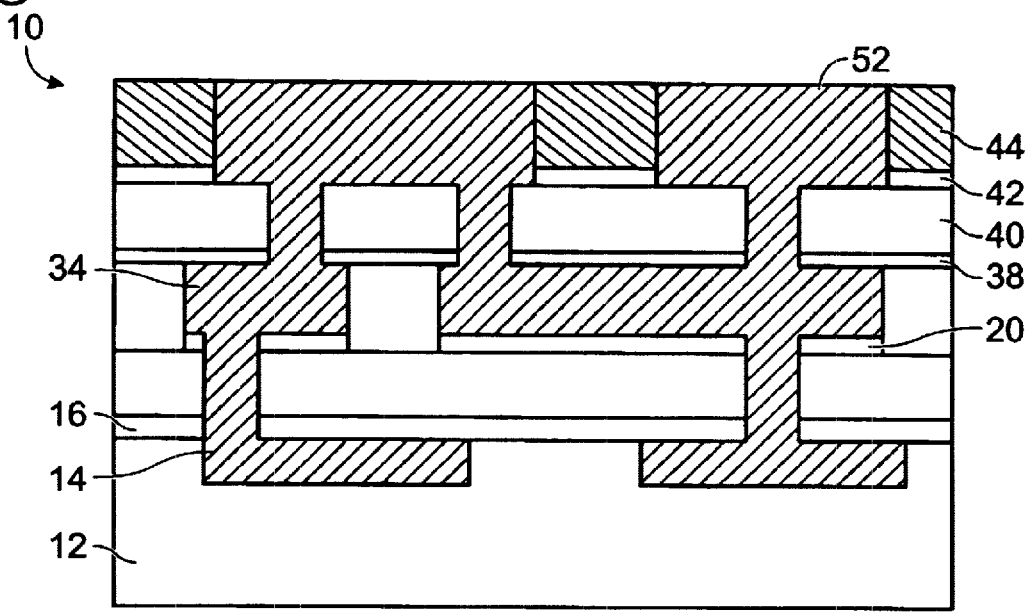
FIG. 7 is a cross sectional view of a low-k inter-level insulator structure following deposition and polishing of an additional metal layer.

Again barrier metal and copper are deposited, and planarized to form a third metal layer 52, as shown in FIG. 7. It may be desirable to leave the second sacrificial insulator 44, which in this case corresponds to the final sacrificial insulator, with its higher mechanical strength, as the final insulator if desirable to support the interconnect structure 10 during subsequent packaging processes. It may also be preferable to leave a sacrificial insulator between some of the low-k layers to provide additional mechanical support for devices with larger numbers of metal layers.

Figure 8:
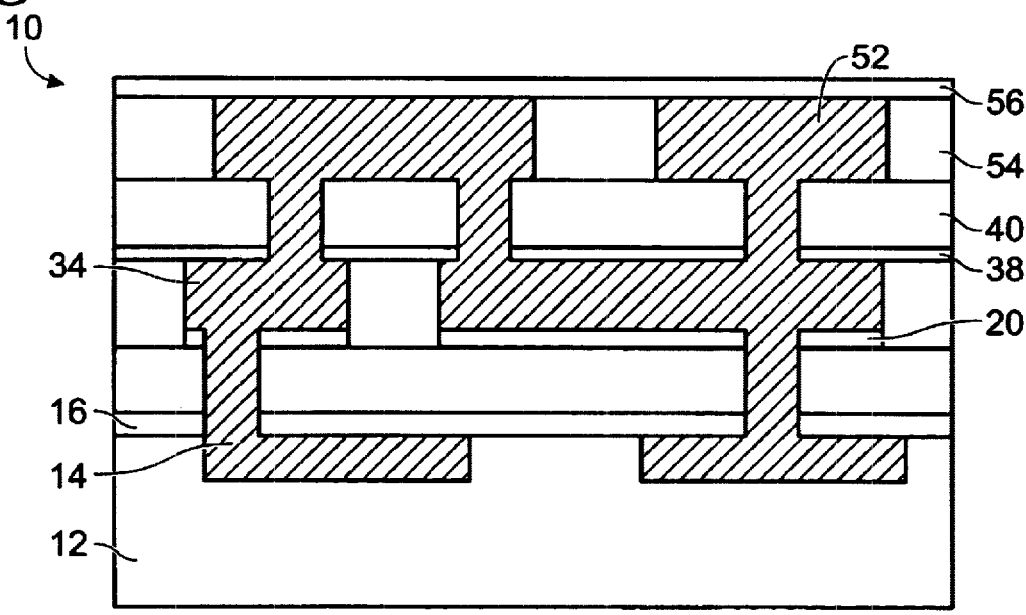
FIG. 8 is a cross sectional view of a low-k inter-level insulator structure following removal of another sacrificial layer and replacement

Alternatively, as shown in FIG. 8, the second sacrificial layer could be removed and replaced by a fourth low-k layer 54. It would also be possible to remove any remaining portion of the second etch stop insulator 42 or the second barrier layer 38. A third barrier layer 56 could then be formed and the process repeated as desired to form additional metal layers with low-k insulating material.

Although preferred embodiments along with some alternatives have been described, the invention is not limited to any specific embodiment. Rather, the scope of the invention is determined based upon the following claims.

What is claimed is:

1. A method of forming a low-k inter-level insulator structure comprising the steps of:
    a) providing a substrate with an initial metal layer thereon;
    b) depositing a passivation insulator overlying the initial metal layer;
    c) depositing a first low-k dielectric layer overlying the passivation insulator;
    d) depositing an etch stop overlying the first low-k dielectric layer;
    e) depositing a sacrificial insulator layer overlying the etch stop;
    f) depositing a hard mask overlying the sacrificial insulator layer;
    g) applying a first photoresist pattern overlying the hard mask and etching via openings in the hard mask;
    h) etching the sacrificial layer where exposed by the via opening until reaching the etch stop, whereby a partial via having a bottom is produced;
    i) applying a second photoresist pattern overlying the hard mask;
    j) etching exposed portions of the hard mask;
    k) etching the etch stop exposed at the bottom of the partial via;
    l) etching the sacrificial layer where it is not covered by the second photoresist pattern, whereby a trench is formed in the sacrificial layer;
    m) etching the first low-k dielectric layer below the bottom of the partial via until the first metal layer is reached, whereby a via is formed;
    n) depositing a second metal layer over the substrate, including all overlying structures, whereby the metal fills the trench and the via to connect with the first metal layer;
    o) polishing the second metal layer until the sacrificial layer is exposed;
    p) removing exposed portions of the sacrificial layer;
    q) depositing a second low-k dielectric layer and back etching to expose the second metal layer, whereby the second low-k dielectric layer replaces the sacrificial layer, which was removed.

2. The method of claim 1, wherein the initial metal layer comprises copper.

3. The method of claim 1, wherein the initial metal layer comprises a barrier metal.

4. The method of claim 3, wherein the barrier metal is TiN, TaN, $Ti_xTa_yN_z$, or WN.

5. The method of claim 1, wherein the passivation insulator is SiC, $Si_xN_y$, or BN.

6. The method of claim 1, wherein the first low-k dielectric layer comprises porous silicon oxide, xergel, or Hydrogensilsesquioxane Resin (HSQ).

7. The method of claim 1, wherein the etch stop comprises $SiO_2$, $Si_3N_4$, SiC, or BN.

8. The method of claim 1, wherein the sacrificial insulator is silicon nitride or silicon dioxide.

9. The method of claim 1, wherein the step of removing exposed portions of the sacrificial layer comprises a wet etch process.

10. The method of claim 1, wherein the step of removing exposed portions of the sacrificial layer comprises a dry etch process.

11. The method of claim 10, wherein the dry etch process comprises an oxide or nitride plasma etching process.

12. The method of claim 1, wherein the second low-k dielectric layer comprises a material that is also used for the first low-k dielectric layer.

13. The method of claim 1, wherein the step of depositing a second low-k dielectric layer comprises a spin-on process.

14. A method of forming a low-k inter-level insulator structure comprising the steps of:

a) providing a first metal layer;

b) depositing a passivation layer overlying the first metal layer;

c) depositing a low-k dielectric layer overlying the passivation layer;

d) depositing an etch stop overlying the low-k dielectric layer;

e) depositing a sacrificial insulator layer overlying the etch stop;

f) forming a via and trench structure by depositing a hard mask overlying the sacrificial insulator layer and patterning the hard mask to form at least one via opening in the hard mask; depositing and patterning a photoresist pattern overlying the hard mask; etching the sacrificial insulator layer at the at least one via opening until reaching the etch stop; etching the hard mask exposed by the photoresist pattern; etching the etch stop at the at least one via opening; etching the sacrificial layer, whereby a trench is formed; and etching the low-k dielectric layer, whereby a via is formed to expose the first metal layer, prior to the step of producing the second metal layer g) producing a second metal layer overlying the sacrificial insulator layer and the exposed first metal layer, whereby the second metal layer fills the trench and via;

h) removing the sacrificial insulator layer; and i) depositing a low-k inter-level insulator overlying the second metal layer and the etch stop, whereby low-k material replaces the sacrificial insulator.

15. The method of claim 14, wherein the first metal layer comprises copper.

16. The method of claim 14, wherein the sacrificial insulator layer is silicon nitride or silicon dioxide.

17. The method of claim 14, wherein the low-k inter-level insulator is porous silicon oxide, xergel, or HSQ.

18. The method of claim 14, wherein the step of removing the sacrificial insulator layer comprises a selective dry etch process.

19. The method of claim 18, wherein the selective dry etch process comprises an oxide or nitride plasma etch.

* * * * *